United States Patent
Gelonese (10) Patent No.: US 9,841,454 B2
(45) Date of Patent: Dec. 12, 2017

(54) ELECTRICAL DEVICE INSTALLATION IMPROVEMENT

(75) Inventor: Giuseppe Antonio Gelonese, Dulwich (AU)

(73) Assignee: Embertec Pty Ltd (AU)

( * ) Notice: Subject to any disclaimer, the term of this patent is extended or adjusted under 35 U.S.C. 154(b) by 1006 days.

(21) Appl. No.: 14/232,308

(22) PCT Filed: Jul. 12, 2012

(86) PCT No.: PCT/AU2012/000840
§ 371 (c)(1),
(2), (4) Date: Mar. 18, 2014

(87) PCT Pub. No.: WO2013/006916
PCT Pub. Date: Jan. 17, 2013

(65) Prior Publication Data
US 2014/0292289 A1    Oct. 2, 2014

(30) Foreign Application Priority Data

Jul. 13, 2011  (AU) ................ 2011902785

(51) Int. Cl.
*H03J 3/00*    (2006.01)
*G01R 31/04*   (2006.01)
*H02J 9/00*    (2006.01)
*H02J 3/00*    (2006.01)
*H01R 25/00*   (2006.01)

(52) U.S. Cl.
CPC ............. *G01R 31/04* (2013.01); *H02J 3/00* (2013.01); *H02J 9/005* (2013.01); *H01R 25/003* (2013.01); *H02J 2009/007* (2013.01)

(58) Field of Classification Search
CPC ........ G01R 29/12; G01R 29/24; G01R 31/04; G01R 31/041; H02J 3/00; H02J 9/005; H02J 2009/007; H01R 25/003; H01R 25/006
See application file for complete search history.

(56) References Cited

U.S. PATENT DOCUMENTS

| | | | | |
|---|---|---|---|---|
| 6,891,478 B2* | 5/2005 | Gardner | ........... | H02J 3/14 307/11 |
| 6,975,926 B2* | 12/2005 | Schanin | ........... | F25D 29/00 236/46 R |
| 7,834,643 B2* | 11/2010 | Yohanan | ........... | H02J 3/1842 323/205 |
| 7,995,033 B2* | 8/2011 | Chen | ........... | G06F 1/3203 315/169.1 |

(Continued)

FOREIGN PATENT DOCUMENTS

JP    2003-271812 A    9/2003
JP    2011-010436 A    1/2011

*Primary Examiner* — Matthew Nguyen
(74) *Attorney, Agent, or Firm* — Craig A. Fieschko, Esq.; DeWitt Ross & Stevens S.C.

(57) ABSTRACT

An energy saving device that is adapted to be connected to a power outlet and further connected to at least one electrical device, said electrical devices drawing power through the energy saving device, the energy saving device including testing means adapted to perform at least one installation verification test and communication means adapted to communicate a validation signal to a monitoring entity when a result of the installation verification test indicates that a correct installation has occurred.

20 Claims, 7 Drawing Sheets

(56) References Cited

U.S. PATENT DOCUMENTS

2011/0169342 A1\* 7/2011 Tinaphong ......... H01R 13/6683
  307/126
2014/0265602 A1\* 9/2014 Milks, III ............... H02J 9/005
  307/80

\* cited by examiner

ELECTRICAL DEVICE INSTALLATION IMPROVEMENT

FIELD OF THE INVENTION

The present invention relates to an apparatus and method for the verification of installation of electrical equipment, in particular verification acceptable to a party not being an installer of the electrical equipment.

BACKGROUND

When a user installable electrical device is installed typically the device is plugged into a suitable outlet that is connected to the mains electrical supply. This is usually a wall outlet, sometimes referred to as a general purpose outlet (GPO), but can also be a power extension board or similar. Verification of the installation, if required, requires no more than the observation, by the installer, that the most basic functions of the device are operational.

Most current electrical devices, and in particular computer and audio visual (AV) devices have a number of power states, such as on, off and standby. The standby power state is one that keeps the electrical device powered to be able to receive a signal, such as a signal from a remote control device, so that it moves to the on power state very quickly. A known shortcoming with standby power state is that power is still being consumed, albeit less than the power being consumed when the device is in the on state. Users of such devices typically leave the device in standby mode for lengthy periods of time, without considering the power use in the standby power state. The resultant use of power in the standby mode can be significant, more so when the number of devices is taken into consideration.

Standby power supply control devices, such as those referred to in WO 2008/064410, which is hereby incorporated by reference, are very useful in such situations as they are able to determine that an electrical device is not in use, which may be in standby power mode or may be when inadvertently left on in full power mode but without being in use, for long periods of time, and are able to cut power to those devices that are connected to the power supply control device without necessarily having any interaction from the user.

These power supply control devices are usually positioned between the GPO and the electrical devices. The installation of these devices can be carried out by either by a qualified installer or by a domestic user.

Standby power supply control devices are often included as part of energy saving incentives backed by such entities as energy retailers, energy distributors energy generators and government bodies. Incentives, which may be free or subsidised supply of the devices, reductions in power bills or any other acceptable incentive, are provided by the entity to a consumer in an attempt to encourage the consumer, be they domestic or commercial, to acquire such devices and to install the devices in a manner such that a reduction in energy use by the consumer is likely to occur. Not every possible installation of the devices will be likely to bring about power savings. The entities wish only to provide the incentives in cases where the devices are installed appropriately, with appropriate electrical equipment such as computer or AV equipment. Electrical devices such as lamps or toasters may not be considered as appropriate electrical equipment due to their infrequent use for long periods of time and/or their lack of a standby power state.

A shortcoming in such incentive schemes is that the entity providing the incentive has great difficulty in verifying that the energy saving devices have been installed in the appropriate manner and are able to provide a reduction in energy usage. If the energy saving device is installed by a qualified installer there is a greater level of confidence that the device is installed correctly so long as the installer is competent and trustworthy. Achieving this level of confidence requires that the installer be trained, and that the installer does not make mistakes, nor engage in fraudulent behaviour.

If the energy saving device is installed by the consumer, then there is comparatively less confidence that that the device has been installed correctly. All that can be known with certainty is that the energy saving device has been purchased by or supplied to the consumer.

Such incentive schemes are open to exploitation as there is no present way available to positively verify correct installation and ensure that the energy saving device is in active use and capable of saving or reducing energy consumption apart from undertaking a physical audit of installations. Such audits are expensive and time consuming and therefore it is not viable to audit every installation that has been undertaken. The result is a low level of confidence that the energy saving devices have actually been installed and installed correctly.

Throughout this specification, the term "qualified installer" refers to a persons or company authorised to install the energy saving device.

SUMMARY OF THE INVENTION

In one form of the invention it may be said to reside in an energy saving device adapted to be connected to a power outlet and to be further connected at least one electrical device, said electrical devices drawing power through the energy saving device, the energy saving device including testing means adapted to perform at least one installation verification test and communication means adapted to communicate a validation signal to a monitoring entity when a result of the installation verification test indicates that a correct installation has occurred.

In preference, the energy saving device is connected to more than one electrical device.

In preference, the testing means includes a processor adapted to monitor the power drawn through the energy saving device and to determine that the changes in that power follow a predetermined acceptable pattern indicating a correct installation.

In preference, the acceptable pattern is chosen to be a pattern which indicates that the at least one electrical device is of a predetermined acceptable type which form a correct installation.

In preference the acceptable pattern is chosen to be a pattern which indicates that the energy consumed by the at least one electrical device exceeds a pre-determined threshold.

In preference, the validation signal is a display of a verification code by the communication means.

In preference, the verification code is not visible to the monitoring entity when the validation signal is not being communicated.

In preference, the monitoring entity is an individual performing an installation of the energy saving device. Alternatively the monitoring entity is a data reception device located remotely from the energy saving device.

In preference, the verification code is unique to the individual energy saving device, or alternatively unique to a defined group of individual energy saving devices.

In preference, the validation signal is one or more symbols displayed on a visual display integral to the energy saving device.

In a further form, the invention may be said to lie in a method of verifying an installation of an energy saving device, the method including the steps of an installer installing the energy saving device in between a mains electrical power outlet and a least one electrical device, the energy saving device measuring power drawn by the electrical device and determining that changes in that power drawn are of a pattern which demonstrates that the electrical devices connected to the energy saving device are of type to constitute a correct installation of the energy saving plug.

In preference, the power measured is true rms power.
In preference, the installer is a qualified installer.
In preference, the installer is a domestic user.

BRIEF DESCRIPTION OF THE DRAWINGS

By way of example, an embodiment of the invention is described more fully hereinafter with reference to the accompanying drawings, in which.

DETAILED DESCRIPTION OF THE INVENTION

Figure 1:
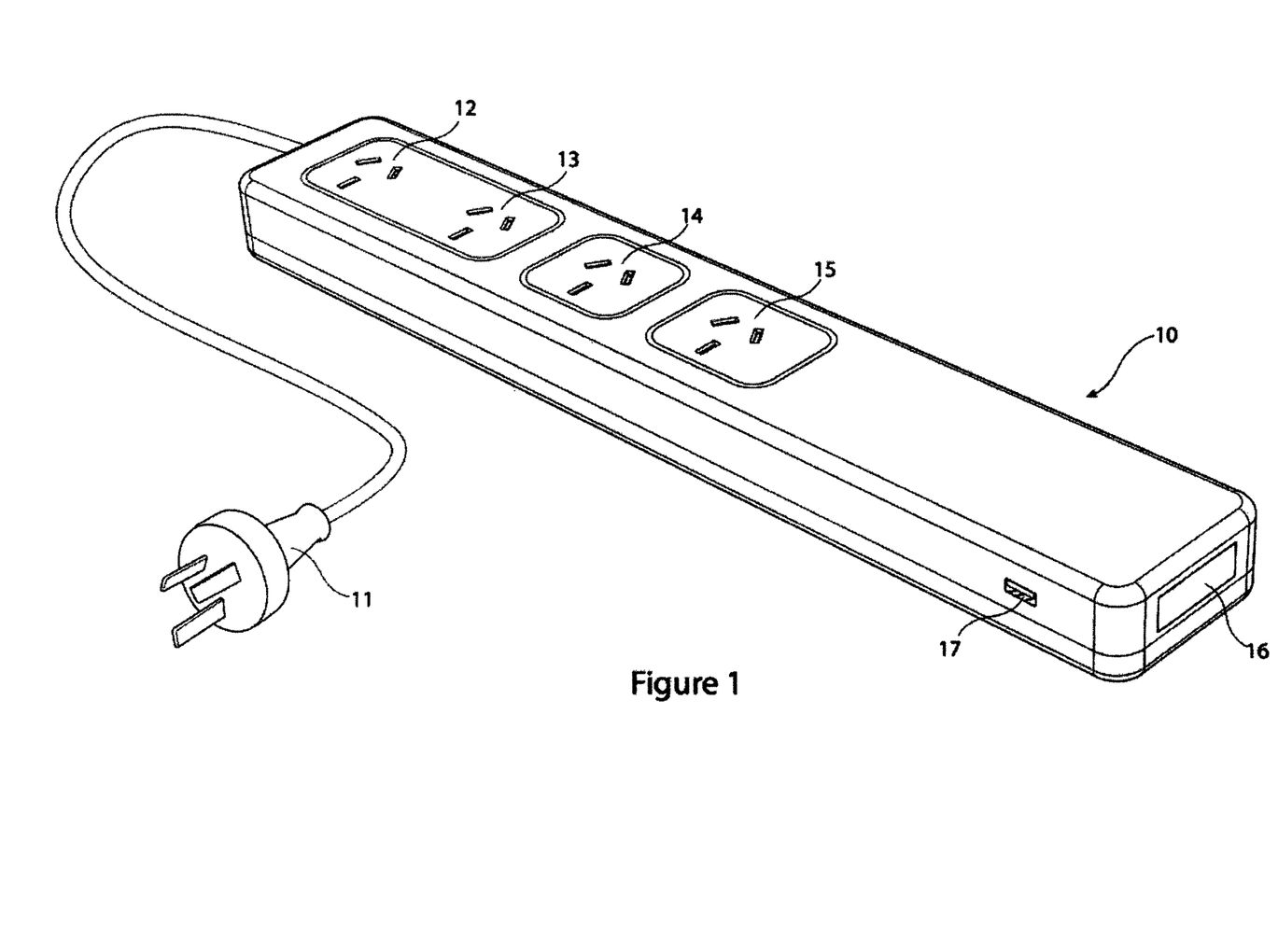
FIG. 1 is an illustration of an energy saving device incorporating the invention.

Referring to FIG. 1, there is an energy saving device 10 which controls the flow of power to electrical devices. The energy saving device is connected to a mains power supply via electrical plug connector 11. The plug then controls the flow of electrical power to electrical devices (not shown) which are plugged into controlled and/or monitored outlets 12, 13, 14, 15. The device also includes a code window 16 for communication with an installer.

The energy saving device operates by monitoring the power drawn through at least one of the outlets 12. This monitoring is used to determine an operational state of at least one electrical device and, based on this determination, to continue or interrupt the supply of power through one or more of the outlets 12, 13, 14, 15.

In an exemplary but not limiting embodiment, a computer is connected to be powered through monitored outlet 12. The computer peripherals and ancillary devices such as monitor, printer and desk lamp, which are only in use when the computer is in use, are connected to, and draw power, through controlled outlet 13, 14. The energy saving device functions by monitoring the characteristics of the power drawn through monitored outlet 12 to determine the power and/or usage state of the computer. When the computer is determined to be in a low power or unused state, the energy saving device interrupts power to the controlled outlets 13, 14, removing power from the peripheral and ancillary devices. This prevents these devices from wasting power by being left on unnecessarily. Outlet 15 is not controlled or monitored, and is used as a convenient place to plug in equipment which is located with the computer equipment but where it is not desirable to switch the power supply off to that equipment.

In a further embodiment, audio visual equipment may be connected to outlet 12. This equipment may be a television. The energy saving device monitors the power drawn by the equipment through the outlet 12. When this monitoring determines that the television has entered a standby state, for example by being "switched off" via a remote control unit, the energy saving device interrupts power to the outlet 12, saving power which would otherwise be used by the device to maintain a standby state when not in use.

Figure 2:
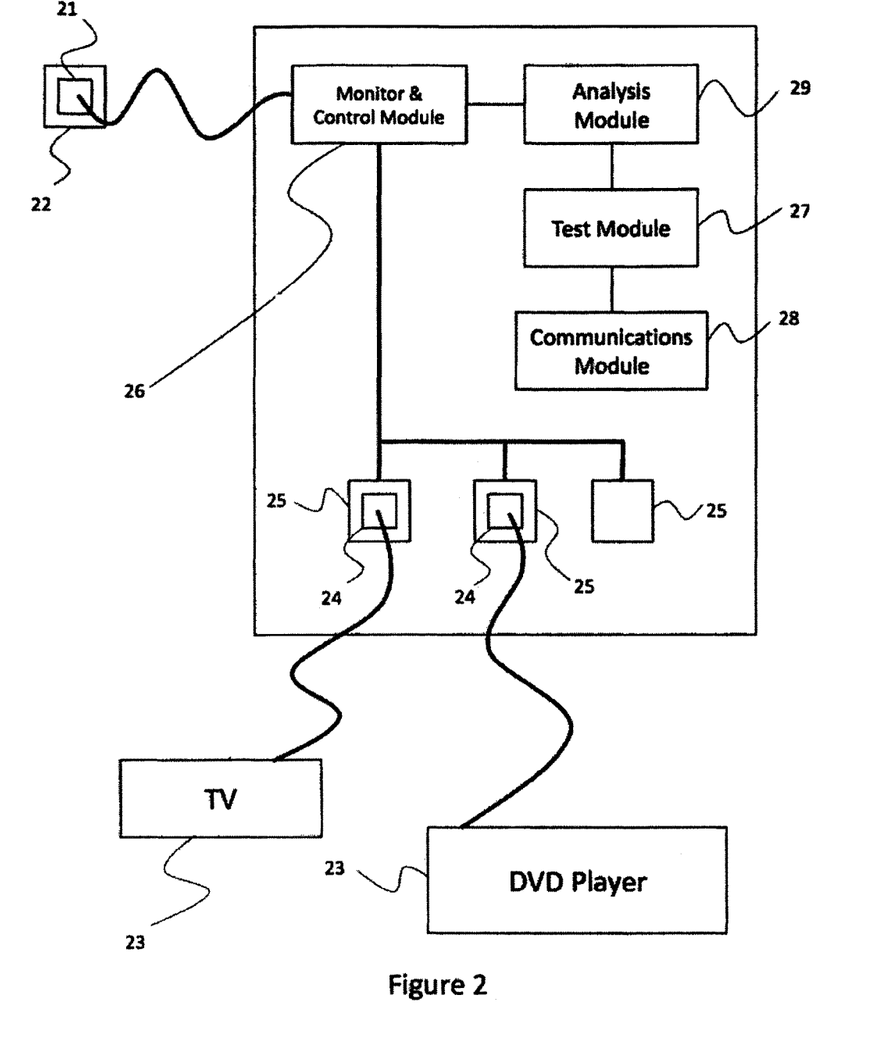
FIG. 2 is a diagrammatic representation of an installation including an energy saving device in accordance with the invention.

FIG. 2 is a diagrammatic representation of an installation incorporating the invention. There is an energy saving device 20 which is installed by plugging plug connector 21 into power supply socket 22. The power supply socket may be a wall outlet (GPO), a power board, or any other plug connectable power supply. Connected to the energy saving device 20 is at least one electrical device 23. This connection is made by plugging plug connector 24 into energy supply socket 25 of the energy saving device. Power for the electrical device is supplied via the energy saving device.

The energy saving device illustrated includes an analysis module 29 and a monitor and control module 26. The monitor and control module controls the flow of power from the power supply socket 22 to at least one power socket 25, which socket supplies power to the connected electrical device or devices 23. The monitor and control module is able to cut off the supply of power to one or more of the sockets 25, in response to signals from the analysis module 29. The, monitor and control module 26 also includes functionality to sense the power being drawn by the electrical devices connected to the power sockets 25. The power sensor may include sensors for any one or more of voltage, current and power factor. The sensors may be capable of sensing True RMS power or any average or peak value of power, voltage or current.

The analysis module receives the output of the sensors from the monitoring and control module. This sensor data is then processed along with other input data and predetermined algorithms to determine when energy may be saved, without unduly inconveniencing the user, by cutting the power supply to one or more of the power sockets 25.

The energy saving device may be installed in circumstances where a third party other than the installer and the user of the connected electrical devices has an interest in knowing the installation status of the energy saving device. This may be the circumstance that the third party is an energy supplier or a government body which is providing incentives for the installation of energy saving devices, and wishes to be confident that the energy saving devices have in fact been installed, and installed correctly. In other circumstances, the third party might be a building owner who is responsible for the power consumption of tenants.

The energy saving device 20 includes test module 27, which is able to perform tests to verify that the energy saving device is installed and installed correctly. In an embodiment, plugging in the energy saving device causes the test module to become active. The test module then monitors the outputs of the monitor and control module. The test module analyses these outputs to determine that electrical devices are connected to the energy saving device and that those electrical devices are of acceptable types.

For example, it may be determined that power savings justifying providing the incentive for the installation of the energy saving device will only be achieved When the connected electrical devices are of a type which includes a standby function, during the activation of which, power can be cut to one or more of the sockets 25 to save energy. A television set may meet these criteria while a lamp would not. The variation with time of the power drawn through the energy saving device, as detected by the sensors, would vary between these two devices.

The test module is able to determine whether the characteristics of the electrical devices connected to the energy saving device are such that the installation is considered acceptable to the third party. This determination may be based on a period of monitoring of the activity of the installation during a period of normal operation. Alternatively, the installer may cause the connected electrical device to perform a series of functions during which the test module monitors the sensor outputs. This series of functions may include turning the electrical device on and off and causing the device to enter one or more low power states such as standby or hibernate states.

In a further alternative embodiment, the test module may monitor fluctuations of the power drawn through the energy saving device. The power drawn by active devices such as computers or television sets will include fluctuations, whilst passive loads such as room heaters and lights will not. The test module detects the magnitude and/or duration of the fluctuations to ensure that a threshold level is reached which indicates the presence of a device which is acceptable as part of a correct installation.

Alternatively to or in combination with measurement of absolute values and fluctuations of power and/or current; the test module may accumulate a value of total energy consumption by the connected electrical devices. A determination that a successful installation has been made occurs only after a pre-determined value of energy consumption has been accumulated. The time to making a determination in this case may depend on the types of devices connected and their power consumption.

A control may be provided to cause the test module to undertake testing, or the test module may monitor the sensor outputs at all times, or at selected times.

The test module communicates the results of the testing to a communications module 28. The function of the communications module is to communicate to the third party the result of the installation testing. In preferred embodiments, this communication is via the installer. This communication is made in such a manner that it is difficult for an installer to report an incorrect or improper installation as a correct installation for which the incentive will be made available. This ensures that the energy supplier or other third party will only pay the incentive in cases where the energy saving device has been installed in a manner which will achieve the desired power savings, or at least will meet the requirements for a valid installation set out by the third party.

In a preferred embodiment, the communications module receives a verification signal from the test module indicating that the test result is that the installation is acceptable. The communication module then communicates a unique verification code to the installer. This verification code is unique to the particular energy saving device unit which is installed.

In a preferred embodiment, the verification code is communicated by displaying the verification code on the body of the energy saving device in a manner which is not visible prior to display by the communications module.

Figure 5A:
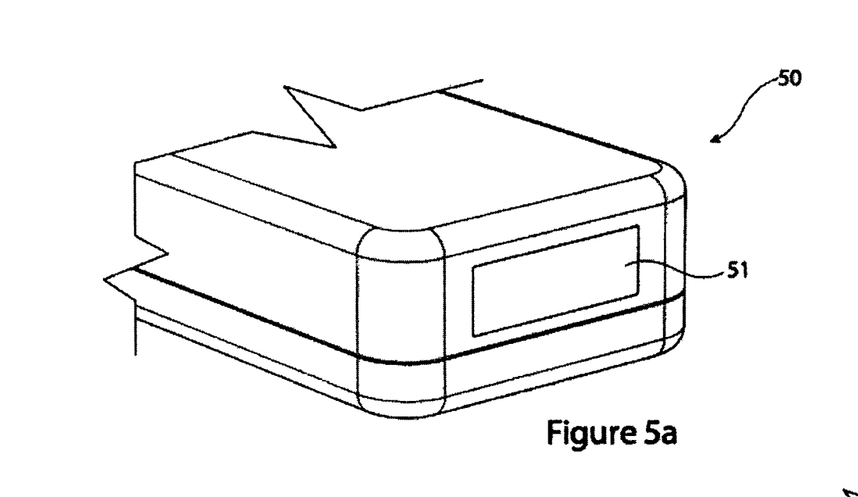
FIG. 5a shows a verification code window in an inactive state.
Figure 5B:
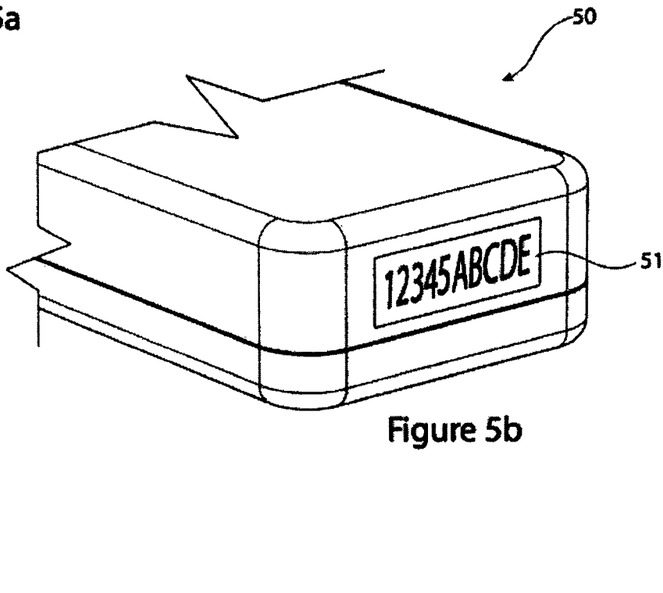
FIG. 5b shows a verification code window indicating correct installation.

Referring to FIG. 5 there is shown an energy saving device 50 having a code window 51. Prior to installation, the code window appears blank as shown in FIG. 5a. No verification code, is visible. When the communications module is activated to display the verification code indicating a successful installation, a verification code is made visible as shown in FIG. 5b. The verification code is thus communicated to the installer for use in a verification procedure.

It is desirable to prevent the Verification code being read without the test module having indicated that the test has been successful. An installer or user may wish to report a successful installation when this has not in fact taken place, in order to gain the incentive offered by the third party for the installation of the energy saving device.

Figure 3:
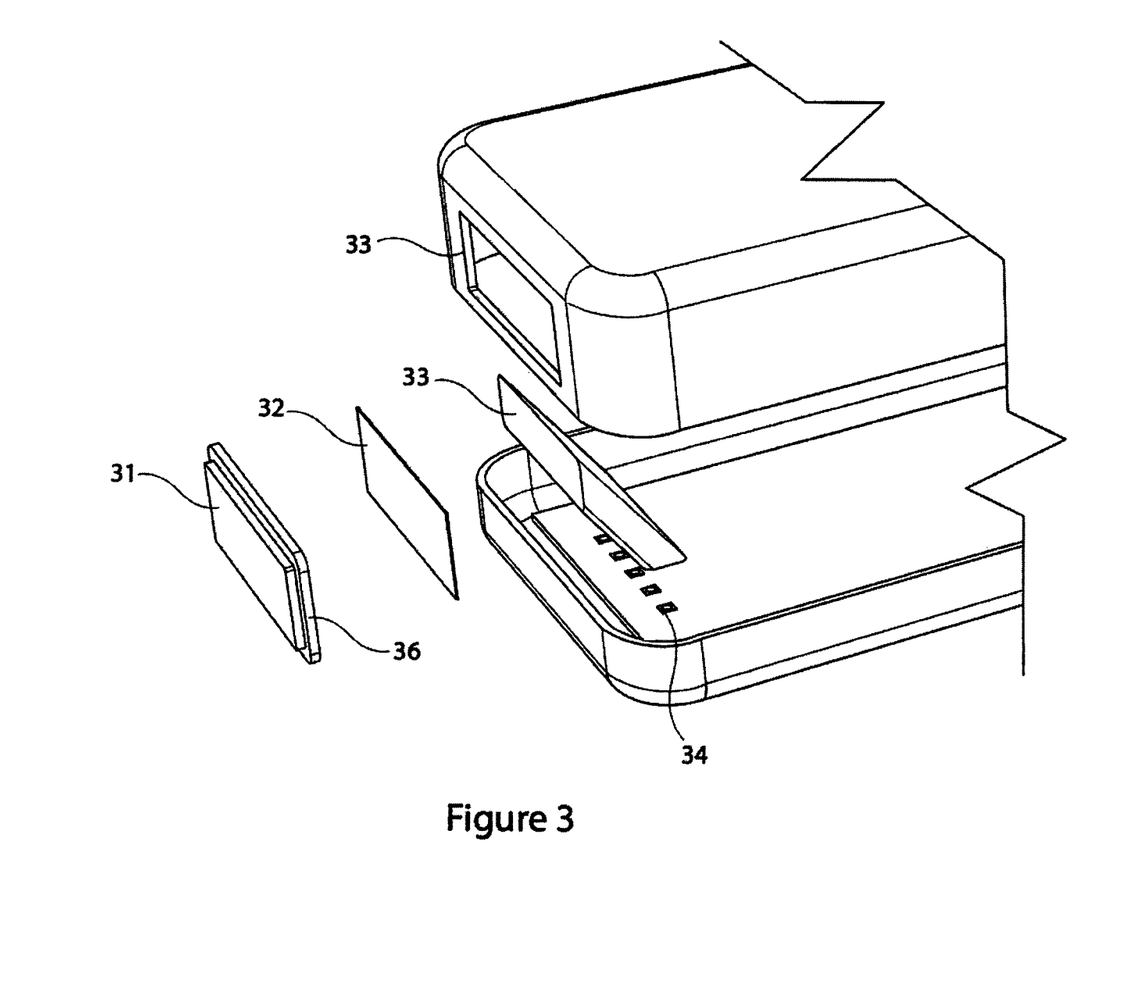
FIG. 3 is an illustration of a communication module of an energy saving device incorporating the invention.

Referring to FIG. 3, there is shown a communications module including an absorption window 31, which has a low light transmission characteristic. There is a dead front decal 32, which contains the verification code that are to be displayed to indicate a successful installation. A dead front decal is a decal displaying an image which is difficult or impossible to see except when backlit. The verification codes are marked upon the decal as areas of varying transparency, but of the same apparent colour when lit and observed from the front. When the decal is backlit, the varying transparency is visible to an observer from the front, thus allowing the verification code to be read. In the preferred embodiment the verification code are a series of letters and numbers formed as translucent areas surrounded by opaque areas.

There is also provided a light source 34, which in this embodiment is one or more LEDs. The light from the light source is conveyed to the decal by a light pipe 33. The code window is secured by a frame 35 which may be integral with the case of the energy saving device, or separately attached.

In use, when the test module determines that an acceptable installation has occurred, the communications module displays the verification code to the installer. This is done by activating the light source 34, the light from which is then conveyed to the back of the dead front decal 32 by the light pipe 33. This backlights the decal. The verification code marked upon the decal transmit this light, which is further transmitted, although much attenuated, by the absorption window. There is sufficient light transmitted through the absorption window to allow an installer to read the verification code.

In use, or prior to installation, when it is not desired for the verification code to be displayed, the code window appears uniformly blank in normal lighting. An installer who may wish to discover the unique verification code without undertaking an installation, in order to report an installation to the third party may attempt to shine a light through the code window, for example by use of a torch. This will be done in the hope that the light from this may be reflected from the light pipe or other internal structures and thus backlight the decal, allowing the verification code to be read. It is desirable that this shall be prevented.

In the communication window of the preferred embodiment the absorption window 31 transmits only a small fraction of the light incident upon it. This amount of transmission is sufficient that the verification code on the decal may be read when backlit. However, when an attempt is made to read the, verification code by shining a light into the code window, the light must pass through the absorption window twice, once prior to and once after reflection through the decal. The amount of light available to read the verification code is thus only that small fraction of that small fraction of the light originally shone onto the code window, which will be insufficient to allow the verification code to be read. In a currently preferred embodiment, five percent of the incident light is transmitted, although higher or lower transmission levels may be used. In the case of the preferred five percent transmission, at most 0.25 percent of the light shone upon the code window in an attempt to read the verification code would be available to read the verification code, which would be insufficient for the purpose.

It is advantageous that the casing of the device be opaque, thus preventing a torch being shone through the casing to illuminate the decal from the rear of the device, or to provide an alternative path for light to be reflected through the decal.

It is advantageous that the absorption window should extend beyond the boundary of the opening in the case of the device which accommodates the code window. In the preferred embodiment, this is achieved by the provision of a lip or step 36 which allows the face of the absorption window to be flush with the casing of the device while still ensuring that there is no gap around the code window through which light might be shone.

In an alternative, less preferred, embodiment, the absorption window may have insignificant light blocking capability or may be absent. This will make it more likely that the verification code can be read by proving light externally from the communication module, but this may be acceptable. In other embodiments, the dead front decal may be replaced with an ordinary translucent decal. In this case the low light transmission of the absorption window is relied upon to prevent the decal being read when not backlit.

Figure 4A:
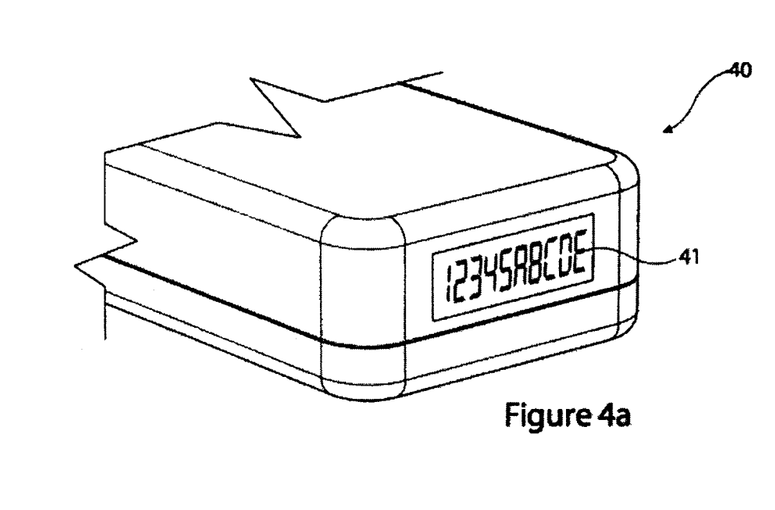
FIG. 4a,b show alternative communication modules
Figure 4B:
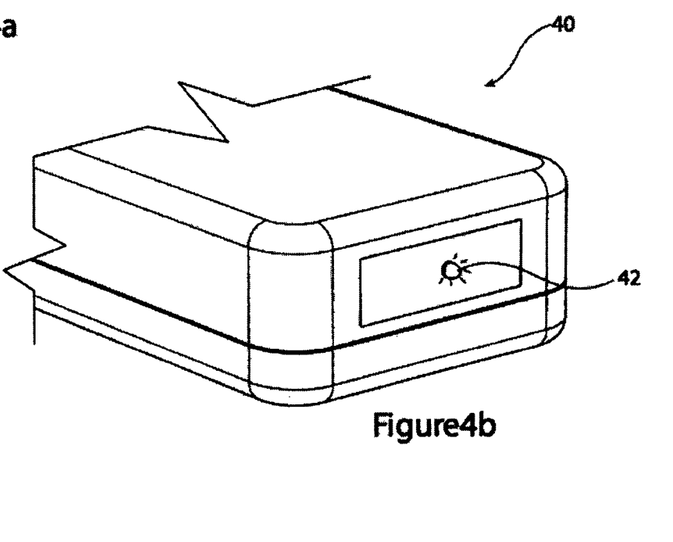

Alternative communication means or modules may be used. In an alternative embodiment shown in FIG. 4, there is an energy saving device 40 with a communication module which includes an LCD screen 41 or similar active display. In this embodiment, the verification code is stored as data either by the communications module or the test module. When the test module determines that the installation has been successfully carried out, this data is used to drive the display to display the verification code to the installer. Since the LCD display 41 is blank when not activated, there is no need for an absorption window to prevent attempts to read the verification code without a successful installation.

Where there is no requirement to avoid fraud, the communications module need only communicate that a correct installation has occurred. As shown in FIG. 4b, the communications module includes an LED 42 which is lit to show that a correct installation has occurred. The installer or another observer reports the correct installation to the third party if necessary. The installer or other observer may be an employee or agent of the third party. Other two state signalling may be used in place of the LED 42.

In an alternative embodiment the verification code is transmitted to the installer as data. The communications module is a data transmission device. Referring to FIG. 1 there is provided as part of the communication module a USB port 17, which may be used for direct connection to a mobile computing device such as a laptop computer or a smartphone carried by the installer. Alternatively or additionally, the communications module may include another a wired connection such as an Ethernet connection, or a wireless connection such as Wi-Fi, which may communicate to a mobile computing device such as a laptop computer or a smartphone carried by the installer.

Having obtained the verification code indicating an acceptable installation, the installer, who may either be a qualified installer or a domestic user of the electrical appliances which are plugged into the energy saving device, then proceeds to report the verification code to the third party. The third party verifies that the supplied verification code correspond to a valid verification code for an energy saving device. Upon such verification, the third party provides whatever incentive it has agreed to supply for a successful installation. This may be direct payment of money to a qualified installer. It may be a rebate on the bill of an domestic user. It may be not billing a domestic user for the cost of the energy saving device. Any other acceptable incentive may be used.

In an alternative embodiment, the communications module communicates the unique verification code directly to the third party incentive supplier. This may be done by means of an internet connection or by any suitable network connection. The communication may be made directly via the electrical wiring to which the energy saving device is connected. The communications device may communicate the verification code to a device already installed at the installation location which is able to communicate to the third party which may be an energy supplier. Such a device may be a Smartmeter, being a meter for measuring the power consumption of a household or other site, and communicating these measurements to an energy supplier. This communication may be by any wired means or by wireless means such as Wi-Fi, Bluetooth or ZigBee, or any other suitable wireless communication method. In this case the third party receives the verification code and checks that it is a valid verification code. Upon verification, the third party provides the promised incentive.

Communication of the verification code to the third party may be by any convenient means. In the case of a domestic user being the installer, the verification code may be communicated, for example, by telephone, by entry into a website or by post.

Verification is done by checking the received verification code against a list of valid verification code supplied by the manufacturer of the energy saving device or of the communication module to the third party.

The verification code may include a checksum which helps to ensure that the verification code have not been copied incorrectly in the process.

Other data may be used to assist with verification, such that all data must be consistent to achieve verification. This data may include a serial number applied to the energy saving device which has a unique relationship to the verification code for that device. The data may include the identity of the qualified installer, in the case that a pool of energy saving devices with a known pool of verification code is provided to each qualified installer. In such a case, even a valid verification code would not result in verification if provided by someone other than that qualified installer.

The third party may not undertake the verification, but may communicate the verification code to the manufacturer of the energy saving device or of the communications module to allow them to perform the validation.

The party performing the validation keeps records of which verification codes have been presented for validation, to prevent re-use of the verification code by an installer in order to gain an incentive without performing a correct installation.

Figure 6:
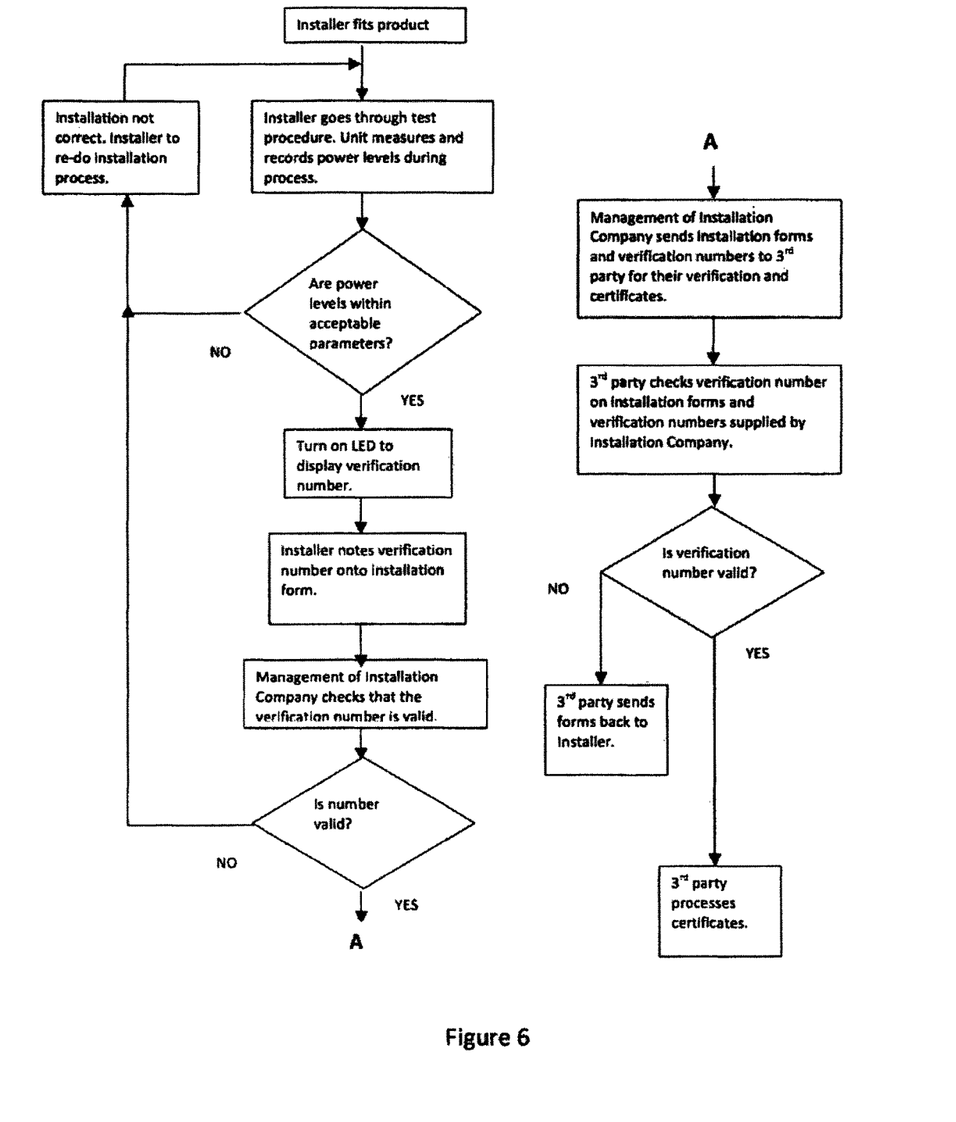
FIG. 6 is a flow chart showing the method of an embodiment of the present invention wherein the user is a qualified installer.
Figure 7:
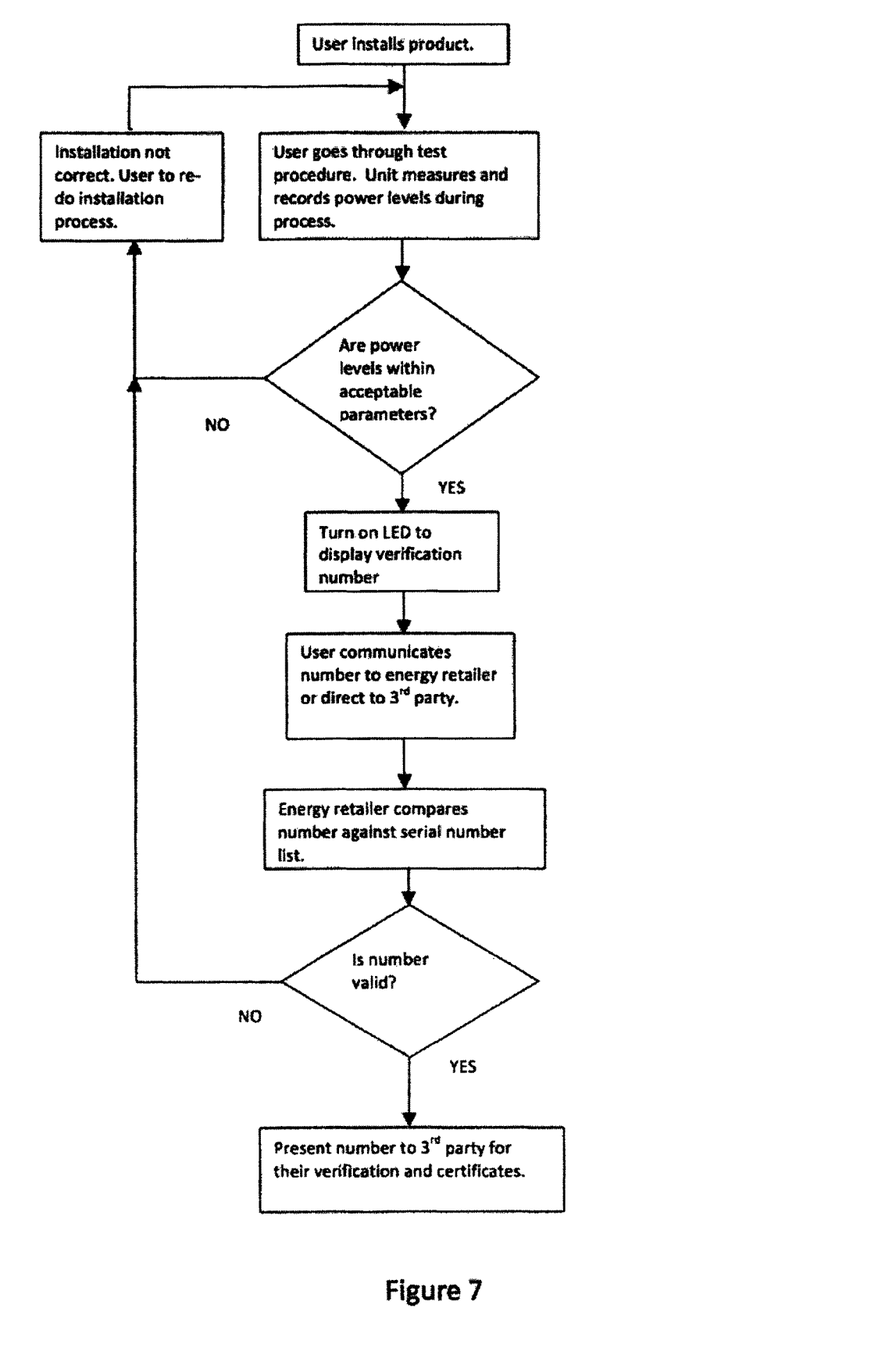
FIG. 7 is a flow chart showing the method of an embodiment of the present invention wherein the user is a domestic user.

Referring to FIG. 6 and FIG. 7, there is shown a method for verification of installation of an energy saving device which involves an installer installing an energy saving device in between the mains power supply and an electrical device. For example, it is common that electrical devices such as AV equipment and computer equipment are "turned off" by being changed to a standby power state, which reduces but does not eliminate, power consumption. These types of devices are then plugged into the energy saving device of the present invention. In some instances one of these attached electrical devices may be considered to be the master device, in that if the master device is off or in a standby state then all other devices, referred to as slave devices, attached to the energy saving device should be off. It may not be the case that power should also be withdrawn from the master device. This may be the case where the master device is a computer.

In other cases, when the main device, for example a television, is in a standby state, it is desirable to remove power from the main device and any associated electrical devices. This is common where there is a subset of electrical devices such as televisions, video equipment, personal video recorders (digital video recorders), CD players, stereo systems, amplifiers, pay-television boxes and so grouped into close proximity and often used in combination with each other.

Once the energy saving device is connected to the appropriate devices, the installer then proceeds to initiate a test procedure in which at least the master electrical device is taken through its various power states, such as off, on and/or standby over a pre-defined period of time. The energy saving device then verifies that the fluctuations in power and/or current and/or voltage, follow a pattern which indicates successful installation. Alternatively, no explicit testing may be made, but the energy saving device may monitor the normal use of the electrical devices connected to the energy saving device to make the same determination.

Alternatively to or in combination with measurement of absolute values and fluctuations of power and/or current; energy consumption may be accumulated. A determination that a successful installation has been made occurs only after a pre-determined value of energy consumption has been accumulated. The time to making a determination in this case may depend on the types of devices connected and their power consumption.

When a determination is made by the energy saving device that the energy saving device is part of a correct installation, the energy saving device provides a signal of successful completion to the installer. This may be in the form of an active LED, data signal or to physically show some verification code. The fact of a successful installation and/or this verification code is then recorded by the installer.

The installation may be being made at the cost of a third party, not the installer or the user of the electrical devices.

In an exemplary case, the third party is an energy retailer wishing to reduce energy consumption by customers.

The verification code is conveyed to the energy retailer who is paying the cost of the installation of the energy saving device.

The verification code may be a verification number or combination of letters or numbers, or any other suitable verification code.

The energy retailer then takes the verification code and enters it into a database of previously provided verification numbers which are unique to each of the energy saving devices that the energy retailer has caused to be installed. Upon a successful match the energy retailer can then have a greater level of confidence that the installation of the energy saving device was carried out in the appropriate manner to ensure that, at least on initial installation, the energy saving device was brought into correct operation or active use.

In the event that the installer does not complete the initial test procedure they will not be able to generate the verification code or number and thus the energy retailer will know that the energy saving device sent out has not been installed in accordance with specific requirements. As such, the energy retailer may choose to add on the cost of the energy saving device to the user's energy bill, the point being to encourage the end user, as they have agreed to receive the device, to ensure that the verification code is entered in a timely manner.

In addition, when the energy saving device is to be installed by a qualified installer the process is similar to that for the user however the qualified installer will then be provided with the verification code or verification signal and will then be required to provide that verification signal to the remote database for cross checking with the unique serial numbers of the energy saving device and cross checked against the name or identification of the installer or company assigned with the installation of the energy saving device.

The verification signal may be provided by the energy saving device in a number of ways to the qualified installer who can then enter such information directly onto a portable computing device that may or may not be directly linked to the Internet. Or the portable computing device may store the verification data for bulk downloading at a later stage, such when the qualified installer returns back to a base station.

The method of the present invention now provides for a new way in which the installation of electronic devices, such as energy saving devices, can be verified as being installed currently and further than such installations are within the parameters of the intended use. This provides the energy retailer and any other party, such as a Government body, a higher level of confidence in the successful installation of such devices than has been available previously.

Additionally, the present invention reduces or removes the requirement for additional audits or checks, thus saving substantial time and money to those that either distribute or financially support the distribution of such energy saving devices.

A further issue arises in that the third party provides incentives for the installation of energy saving devices based on the assumption that the devices will remain installed and continue to provide energy savings. Energy saving devices which work by causing appliances to be switched off or switched into lower power modes, may cause some inconvenience to a user of the appliances. Such inconvenience is generally minor, but may nevertheless be sufficient to motivate the user to uninstall the energy saving device. Where the verification code is held as data, this may change periodically, and the user may be required to provide this new verification code to verify that the energy saving device is still in use and to ensure that the user continues to receive the incentives.

Although the invention has been herein shown and described in what is conceived to be the most practical and preferred embodiments, it is recognized that departures can be made within the scope of the invention, and that various modifications may be made in details of design and construction [and process steps, parameters of operation etc without departing from the scope and ambit of the invention.

What is claimed is:

1. An energy saving device adapted to be installed between a power outlet and an electrical device whereby the electrical device draws power through the energy saving device, the energy saving device being configured to:

a. connect to the electrical device,
b. monitor power drawn from the power outlet by the electrical device through the energy saving device, and
c. provide a validation signal indicative of correct installation of the energy saving device when the monitored power has predetermined characteristics.

2. The energy saving device of claim 1 further:
a. including one or more sockets thereon;
b. being configured to cut or reduce power to at least one of the sockets when the monitored power is characteristic of a predetermined state of the electrical device.

3. The energy saving device of claim 1 wherein the validation signal is characterized by an alphanumeric verification code which becomes visible when the monitored power has predetermined characteristics.

4. The energy saving device of claim 1 further including:
a. a light source activated to emit illumination when the monitored power has predetermined characteristics, and
b. a surface bearing an alphanumeric verification code thereon, the verification code only being visible when illuminated by the light source,
wherein the visible verification code defines the validation signal.

5. A method of verifying correct installation of an energy saving device between an electrical power outlet and an electrical device, the method including the energy saving device performing the following steps:
a. monitoring the power drawn by the electrical device through the energy saving device, and
b. determining whether changes in the drawn power follow a pattern corresponding to the electrical device being of a predetermined type.

6. The method of claim 5 further including the step of the energy saving device emitting a validation signal when changes in the drawn power follow a pattern corresponding to the electrical device being of a predetermined type.

7. The method of claim 5 further including the step of the energy saving device cutting or reducing power to a socket thereon when the drawn power is characteristic of a predetermined state of the electrical device.

8. The method of claim 6 wherein the validation signal is a visible display of a verification code on the energy saving device.

9. The method of claim 8 wherein the verification code is not visibly displayed on the energy saving device when the validation signal is not emitted.

10. The method of claim 8 wherein the energy saving device includes:
a. a surface bearing the verification code thereon, and
b. a light source adapted to illuminate the surface and thereby visibly display the verification code, wherein the light source illuminates the surface only when the validation signal is emitted.

11. The method of claim 5 further including the step of communicating a validation signal to a monitoring entity upon determining that the pattern corresponds to the electrical device being of a predetermined type.

12. The method of claim 5:
a. wherein the energy saving device includes:
  (1) a master socket:
    i. to which the electrical device is connected, and
    ii. receiving power from the electrical power outlet, and
  (2) a slave socket receiving power from the electrical power outlet,
b. further including the step of cutting or reducing power to the slave socket when the monitored power is characteristic of a predetermined state of the electrical device.

13. The energy saving device of claim 1 including:
a. a test module adapted to perform at least one installation verification test wherein correct installation of the energy saving device between the power outlet and the electrical device is verified or denied, and
b. a communication module adapted to provide the validation signal when correct installation of the energy saving device is verified.

14. The energy saving device of claim 13 wherein the test module includes a processor adapted to:
a. monitor power drawn from the power outlet by the electrical device through the energy saving device, and
b. determine whether changes in the drawn power follow a pattern corresponding to correct installation of the energy saving device.

15. The energy saving device of claim 14 wherein the changes in drawn power follow the pattern corresponding to correct installation when the electrical device is of a predetermined type.

16. The energy saving device of claim 1 wherein the validation signal is a visible display of a verification code.

17. The energy saving device of claim 16 wherein the verification code is not visibly displayed when the validation signal is not provided by the energy saving device.

18. The energy saving device of claim 16 wherein the energy saving device includes:
a. a surface bearing the verification code thereon, and
b. a light source adapted to illuminate the surface and thereby visibly display the verification code, wherein the light source illuminates the surface only when the validation signal is provided by the energy saving device.

19. The energy saving device of claim 1 wherein the validation signal is one or more symbols displayed on a visual display provided on the energy saving device.

20. The energy saving device of claim 1 wherein the energy saving device is further configured to provide the validation signal to a data reception device located remotely from the energy saving device.

* * * * *